(12) United States Patent
Handy et al.

(10) Patent No.: US 11,005,262 B2
(45) Date of Patent: May 11, 2021

(54) ARC MITIGATION IN ELECTRICAL POWER DISTRIBUTION SYSTEM

(71) Applicant: GE Aviation Systems Limited, Gloucestershire (GB)

(72) Inventors: Peter James Handy, Cheltenham (GB); Ross Jonathan Williams, Cheltenham (GB)

(73) Assignee: GE Aviation Systems Limited, Gloucestershire (GB)

( * ) Notice: Subject to any disclaimer, the term of this patent is extended or adjusted under 35 U.S.C. 154(b) by 346 days.

(21) Appl. No.: 16/007,244

(22) Filed: Jun. 13, 2018

(65) Prior Publication Data

US 2018/0366946 A1    Dec. 20, 2018

(30) Foreign Application Priority Data

Jun. 19, 2017  (GB) ..................................... 1709708

(51) Int. Cl.
| H02H 9/02 | (2006.01) |
| H01L 23/00 | (2006.01) |
| H02H 1/00 | (2006.01) |
| H02H 3/093 | (2006.01) |
| H02H 3/08 | (2006.01) |

(52) U.S. Cl.
CPC .............. *H02H 9/025* (2013.01); *H01L 24/48* (2013.01); *H02H 1/0023* (2013.01); *H02H 3/08* (2013.01); *H02H 3/093* (2013.01); *H01L 2224/48091* (2013.01)

(58) Field of Classification Search
CPC ......... H03K 17/0822; H03K 19/00315; H02H 3/025; H02H 3/08; H02H 3/087; H02H 3/093; H02H 3/202; H02H 3/28; H02H 3/338; H02H 1/0015; H02H 1/0023; H02H 9/025; H01L 24/48
USPC .................................. 361/42, 87, 93.1, 93.9
See application file for complete search history.

(56) References Cited

U.S. PATENT DOCUMENTS 2,988,700 A  *  6/1961  Rosinek ............... G01R 19/155
                                                            324/122
5,752,047 A     5/1998  Darty et al.
(Continued)

FOREIGN PATENT DOCUMENTS

CN      101453117 A1    6/2009
EP        0110540 A1 *  6/1984  ............... C09D 4/00
(Continued)

OTHER PUBLICATIONS

Intellectual Property Office; Search and Examination Report in Application No. GB1709708.0; dated Dec. 13, 2017; 3 pages.
(Continued)

*Primary Examiner* — Yemane Mehari
(74) *Attorney, Agent, or Firm* — McGarry Bair PC

(57) ABSTRACT

A circuit to mitigate arc failures in an electrical power distribution system can include a solid state distribution system connected to a source of power and to a load, a solid state power controller (SSPC) having a set of field effect transistors (FETs) responsive to command signals from the SSPC wherein an arc in a wire bond of a failed FET can trigger a predetermined sequence to quench the arc and isolate remaining wire bond material in the failed FET from contaminating a creepage path.

20 Claims, 7 Drawing Sheets

(56) References Cited

U.S. PATENT DOCUMENTS

| | | | |
|---|---|---|---|
| 5,774,000 A * | 6/1998 | Vercellotti | H03K 17/08142 327/110 |
| 6,664,656 B2 * | 12/2003 | Bernier | B64D 41/00 244/60 |
| 7,177,125 B2 | 2/2007 | Lazarovich et al. | |
| 7,701,681 B2 | 4/2010 | Dooley | |
| 8,093,904 B2 | 1/2012 | Ohta et al. | |
| 8,395,873 B2 | 3/2013 | Rozman et al. | |
| 8,847,664 B2 * | 9/2014 | Chimento | H02M 1/32 327/405 |
| 9,335,366 B2 | 5/2016 | Handy | |
| 9,887,694 B2 * | 2/2018 | Greither | H03K 17/122 |
| 2011/0299201 A1 * | 12/2011 | Rozman | H02H 1/0015 361/42 |
| 2015/0381111 A1 | 12/2015 | Nicolescu et al. | |
| 2017/0054438 A1 * | 2/2017 | Handy | H02H 3/087 |
| 2020/0021107 A1 * | 1/2020 | Collins | H02H 7/222 |

FOREIGN PATENT DOCUMENTS

| | | | |
|---|---|---|---|
| WO | 2013139373 A1 | 9/2013 | |
| WO | WO-2013139373 | * 9/2013 | H03K 17/082 |

OTHER PUBLICATIONS

Chinese Patent Office; First Office Action in Application No. 201810633072.8; dated May 29, 2019; 5 pages.

* cited by examiner

ARC MITIGATION IN ELECTRICAL POWER DISTRIBUTION SYSTEM

BACKGROUND OF THE INVENTION

Commercial aircraft typically include an electrical power distribution system which can distribute electricity to loads on the aircraft and protect wires and loads from hazards. Solid state distribution units within the electrical power distribution system contain many semiconductors to efficiently distribute high voltage direct current and/or alternating current. An arc failure of a single semiconductor at high voltages needs to be managed.

BRIEF DESCRIPTION OF THE INVENTION

In one aspect, a circuit to mitigate arc failures in an electrical power distribution system includes a solid state distribution unit having an input and an output, wherein the input is connected to a source of power and output is connected to a load, and a solid state power controller (SSPC) has a set of field effect transistors (FETs) connected between the input and the output and is responsive to command signals from the SSPC. Each FET in the set has an input power track spaced from an output power track with a creepage path extending between the input power track and the output power track, a power semiconductor on the input power track, and a wire bond electrically coupled between the power semiconductor and the output power track. The SSPC is configured to command the set to open and close in a predetermined sequence wherein an arc in the wire bond of a failed FET in the set will trigger the predetermined sequence to control current in the failed FET including controlling timing of the predetermined sequence, to quench the arc and isolate remaining wire bond material in the failed FET from contaminating the creepage path, and enable current to bypass the failed FET through at least one other FET in the set to maintain power to the load.

In another aspect, a method of mitigating an arc failure in an electrical power distribution system includes a solid state distribution unit having an input and an output, wherein the input is connected to a source of power and output is connected to a load, and a solid state power controller (SSPC) having a set of field effect transistors (FETs) connected between the input and the output and responsive to command signals from the SSPC. Each FET in the set has an input power track spaced from an output power track with a creepage path extending between the input power track and the output power track, a power semiconductor on the input power track, and a wire bond electrically coupled between the power semiconductor and the output power track. The method includes detecting current through each FET in the set, commanding the set of FETs to open if the detected current exceeds a threshold, commanding the set of FETs to close if the detected current continues to rise after the command to open, indicating an arc failure in a failed FET, determining that an arc has quenched, waiting a predetermined time after determining that the arc has quenched, and commanding the set of FETs to open after the predetermined time.

In yet another aspect, a module to mitigate arc failures in an electrical power distribution system in an aircraft, the module including a solid state distribution unit having an input and an output, wherein the input is adapted to connect to a source of power and output is adapted to connect to a load in the electrical power distribution system, and a solid state power controller (SSPC) having a set of field effect transistors (FETs) connected between the input and the output and responsive to command signals from the SSPC. Each FET in the set has an input power track spaced from an output power track with a creepage path extending between the input power track and the output power track, a power semiconductor on the input power track, and a wire bond electrically coupled between the power semiconductor and the output power track. The SSPC is configured to command the set to open and close in a predetermined sequence, wherein an arc in the wire bond of a failed FET in the set will trigger the predetermined sequence to control current in the failed FET to quench the arc and isolate remaining wire bond material in the failed FET from contaminating the creepage path, and enable current to bypass the failed FET through at least one other FET in the set

DESCRIPTION OF EMBODIMENTS OF THE INVENTION

Figure 1:
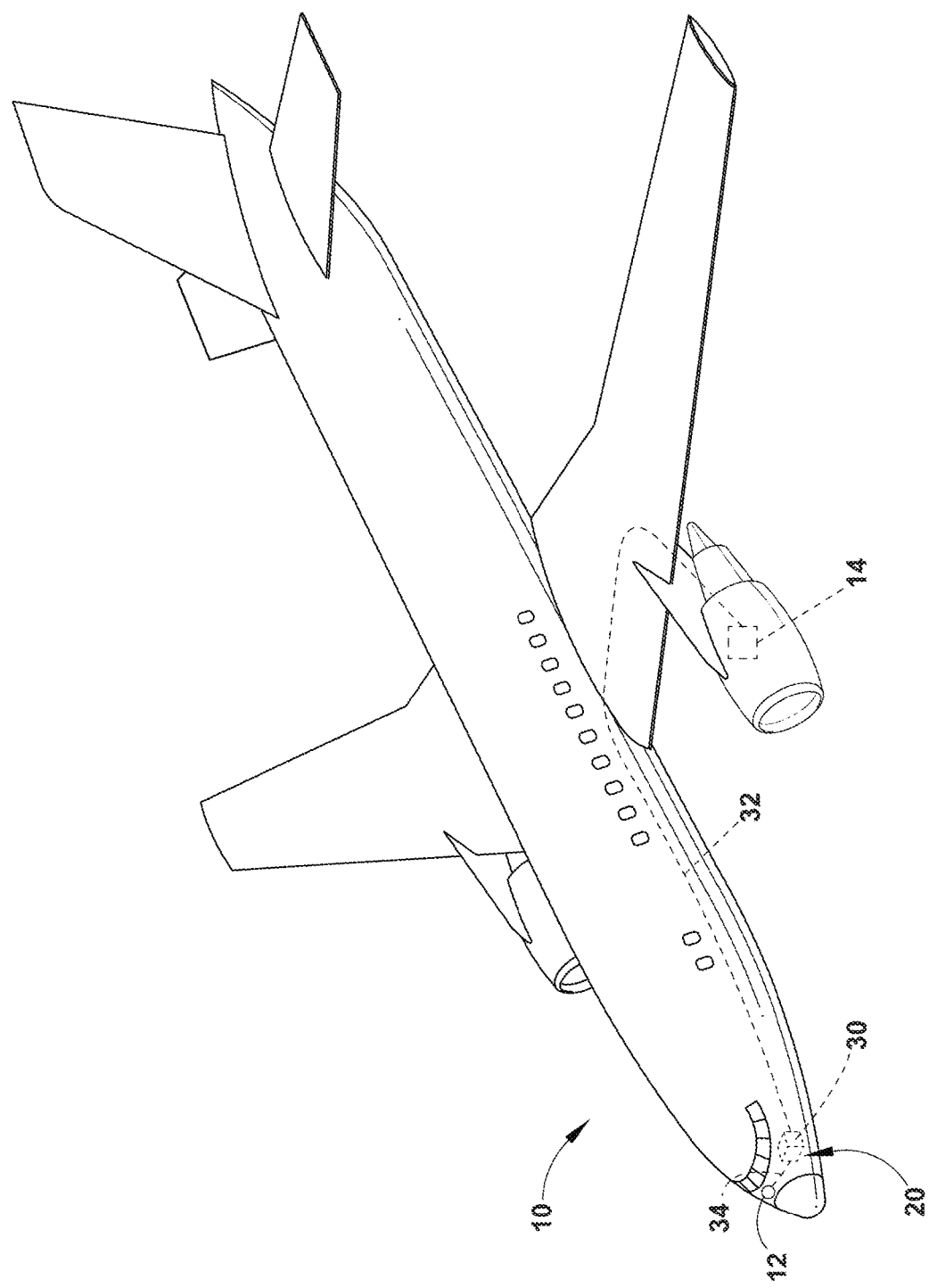
FIG. 1 is a schematic perspective diagram of an aircraft including an electrical power distribution system according to various aspects described herein.

The described embodiments of the present disclosure are directed to an electrical power distribution system. For purposes of illustration, the present disclosure will be described with respect to an aircraft electrical power distribution system. It will be understood, however, that the present disclosure is not so limited and can have general applicability in non-aircraft applications, such as solar power distribution systems, electric vehicles, trains, or ships, in non-limiting examples.

As used herein "a set" can include any number of the respectively described elements, including only one element. Additionally, all directional references (e.g., radial, axial, proximal, distal, upper, lower, upward, downward, left, right, lateral, front, back, top, bottom, above, below, vertical, horizontal, clockwise, counterclockwise, upstream, downstream, aft, etc.) are only used for identification purposes to aid the reader's understanding of the present disclosure, and do not create limitations, particularly as to the position, orientation, or use of the present disclosure. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 schematically illustrates an aircraft 10 with an electrical power distribution system 20 (shown in phantom) for distributing power to one or more loads 12 in the aircraft 10 from a source of power 14. The electrical power distribution system 20 can be configured to withstand electric potential of at least 150 volts of alternating current, or at least 270 volts of direct current. While illustrated in a commercial aircraft, the electrical power distribution system 20 can be used in any type of aircraft, for example, without limitation, fixed-wing, rotating-wing, rocket, commercial aircraft, personal aircraft, and military aircraft, as well as any vehicle requiring similar protection. The electrical power distribution system 20 can be located anywhere within the aircraft, not just the nose as illustrated. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
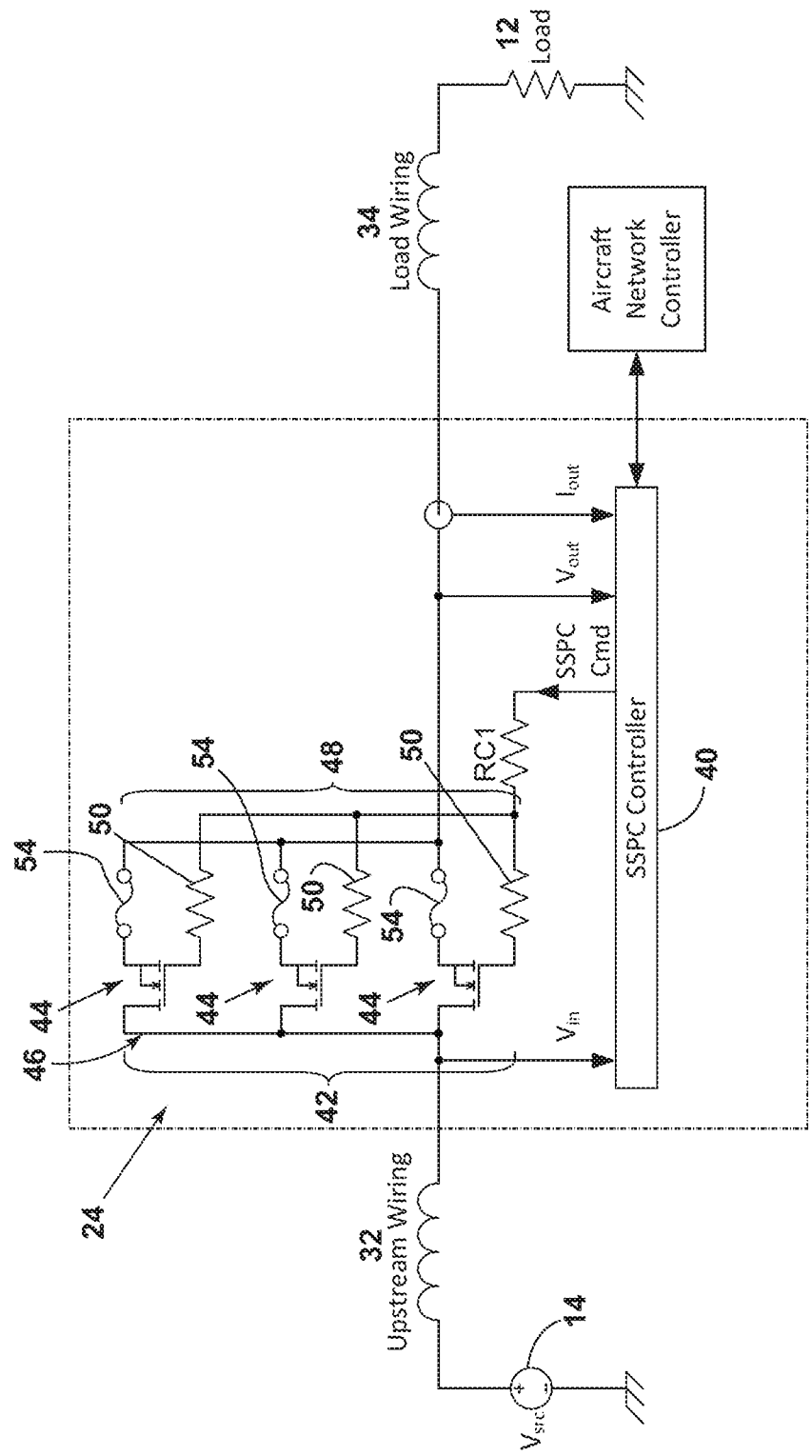
FIG. 2 illustrates a schematic view of an arc mitigation circuit according to various aspects described herein.

Looking now also at FIG. 2, the electrical power distribution system 20 includes a circuit or module 24 having a solid state distribution unit 30 with an input 32 connected to the source of power 14 and an output 34 connected to the load 12. While the source of power 14 is shown in the engine of the aircraft 10 and the load is shown in the nose of the aircraft 10, the source of power 14 and the load 12 can be in any suitable form. For example, the source of power 14 can be in the form of a generator or a battery, and the load can be in the form of avionics including but not limited to control, communications, navigation, display, and anti-collision systems. The input 32 may include wiring and connections between the circuit 24 and the source of power 14, and the output 34 may include wiring and connections between the circuit 24 and the load 12.

The electrical power distribution system 20 further includes a solid state power controller (SSPC) 40, which is schematically illustrated in FIG. 2. The circuit 24 includes a set 42 of field effect transistors (FETs) 44. The field effect transistors 44 can be power semiconductors connected in parallel between the input 32 and the output 34 and are responsive to command signals from the SSPC 40, which can detect current through each FET 44 in the set 42.

Furthermore, the circuit 24 can include an input power track 46 and an output power track 48 that connects the set 42. Looking now also at FIGS. 3A-3D, between each FET 44 and the output track 48 is a resistance (here in the form of a creepage path 50 between the input track 46 and the output track 48) and an interconnect in the form of a wire bond 54 to electrically couple the FET 44 to the output power track 48. The wire bond 54 can be made of any suitable material such as aluminum, copper, silver, or gold, and can be attached to the FET 44 and the output power track 48 by any suitable method such as ball bonding, wedge bonding, or compliant bonding. The wire bond 54 is preferably free of a conformal coating such as acrylic, silicone, or Parylene. The interconnect may comprise forms other than a wire bond 54, including but not limited to a power overlay (POL) die.

The input power track 46, the output power track 48, the FET 44, and the wire bond 54 can be disposed on or in a substrate 60 such as a printed circuit board. The substrate 60 can include an insulative portion 64 and a bottom conductive ground plane 66. The insulative portion 64 can be made of material such as, but not limited to silicon, silicon dioxide, aluminum oxide, sapphire, germanium, gallium arsenide (GaAs), an alloy of silicon and germanium, or indium phosphide (InP), and the bottom conductive ground plane 66 can be made of copper or any suitable conductive material.

The creepage path 50 comprises a gap 58 separating the input power track 46 from the output power track 48. A conformal coating material such as acrylic, silicone, or Parylene can be applied to the creepage path 50 to prevent debris from a failed wire bond 54 from contaminating the creepage path 50.

Figure 3A:
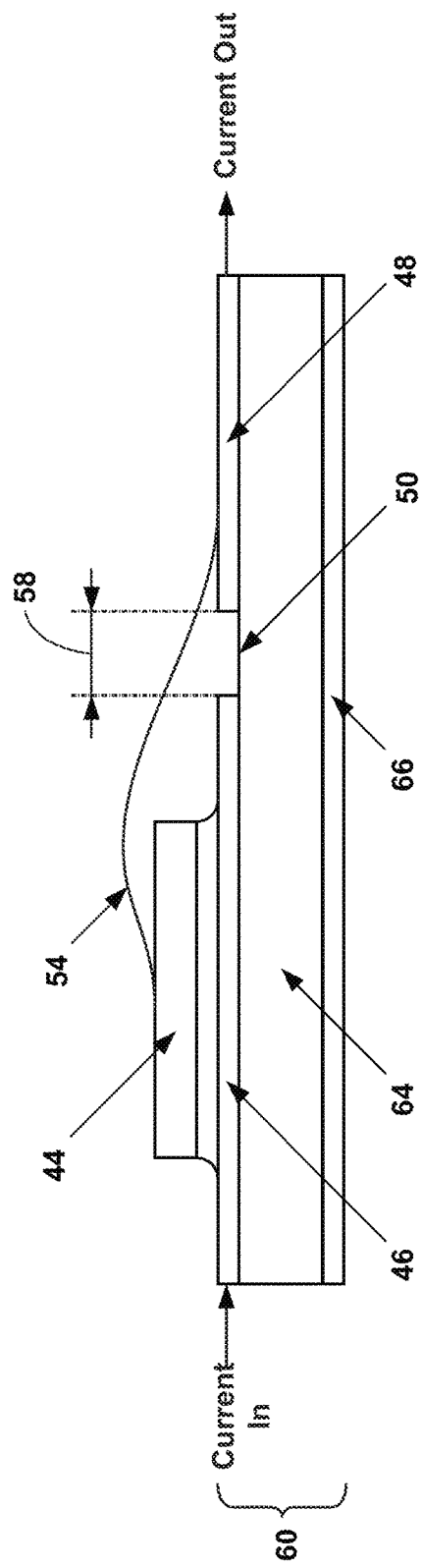
FIGS. 3A-3D illustrate a side view of elements of a field effect transistor (FET) according to various aspects described herein.

When the FET 44 is closed and operating normally, as illustrated by FIG. 3A, current (I) can flow through the input power track 46 and the FET 44 and bypass the creepage path 50 via the wire bond 54 to flow through the output power track 48. When the FET 44 is open, current does not flow through the input power track 46 and the semiconductor, therefore the wire bond 54 and the output power track 48 also do not carry current. When the SSPC is commanded closed, the failure of a single FET 44 in either an open or short circuit mode has negligible effect.

Figure 3B:
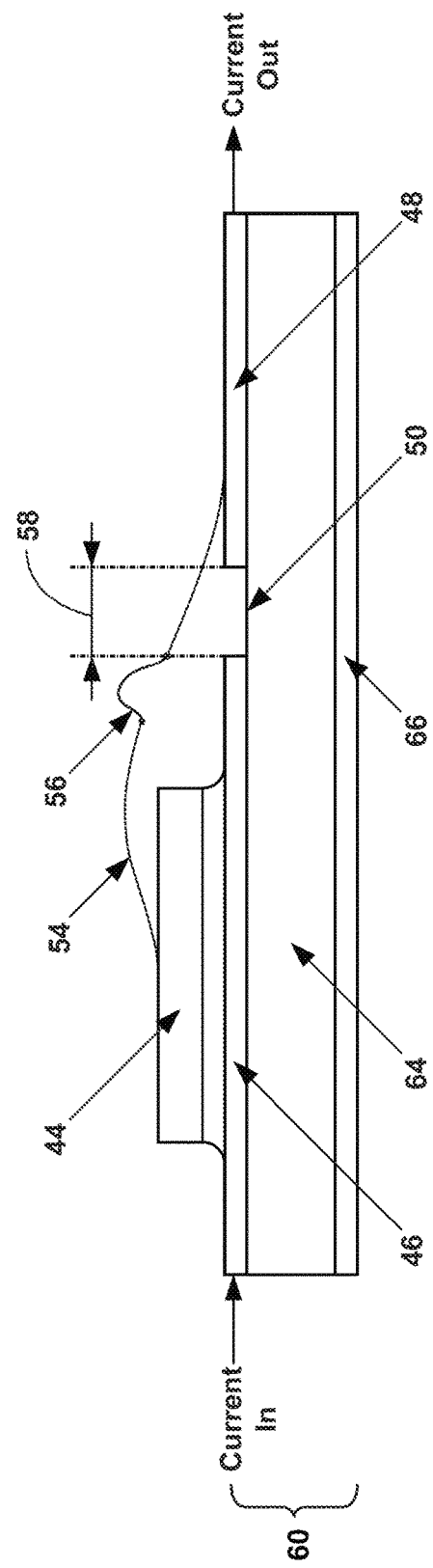
Figure 3C:
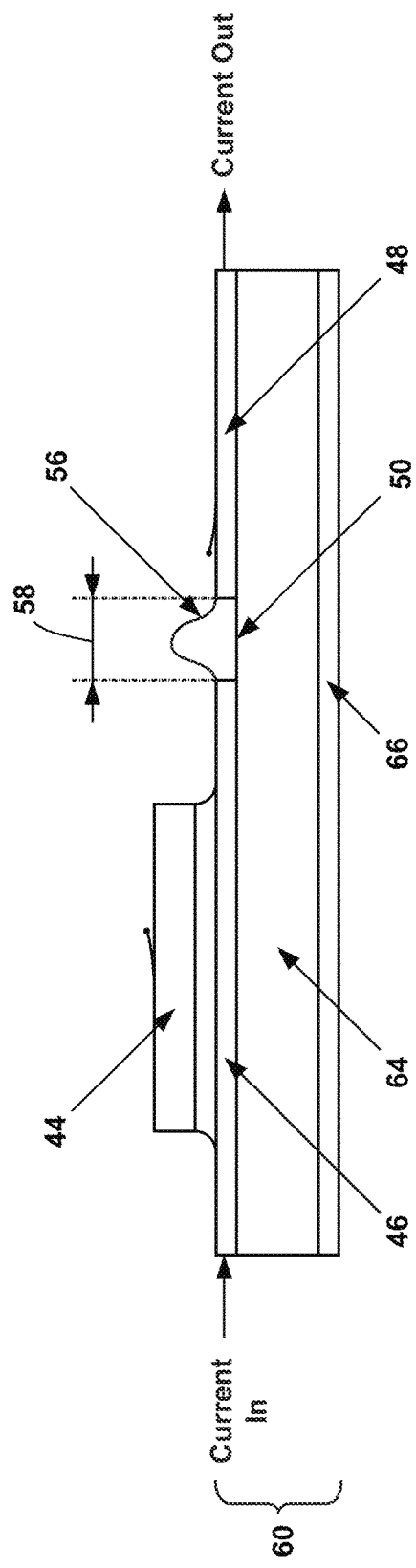

However, when the SSPC is commanded open, the failure of a single FET 44 typically results in the melting of the wire bond 54 and the subsequent striking of an arc 56 across a break in the wire bond as shown in FIG. 3B. This can be referred to as an arc failure. If this arc 56 is left uninterrupted in a DC electrical system, it will continue to burn until source power is removed. During this time the creepage path 50 can become contaminated due to permanent damage caused by the high temperature (6000K+) of the arc as the arc propagates directly across the contaminated creepage path 50 as shown in FIG. 3C. If such an arc 56 were allowed to continue unabated within the circuit 24 containing multiple FETs 44, it might propagate to other FETs 44 within the circuit. The SSPC 40 is configured to detect an arc 56 in a failed FET 44. A FET 44 can fail for many reasons. Some failures can be caused by excess temperature, excess current or voltage, ionizing radiation, mechanical shock, stress or impact. Other failures can arise due to contamination, mechanical stress, or open or short circuits.

Figure 3D:
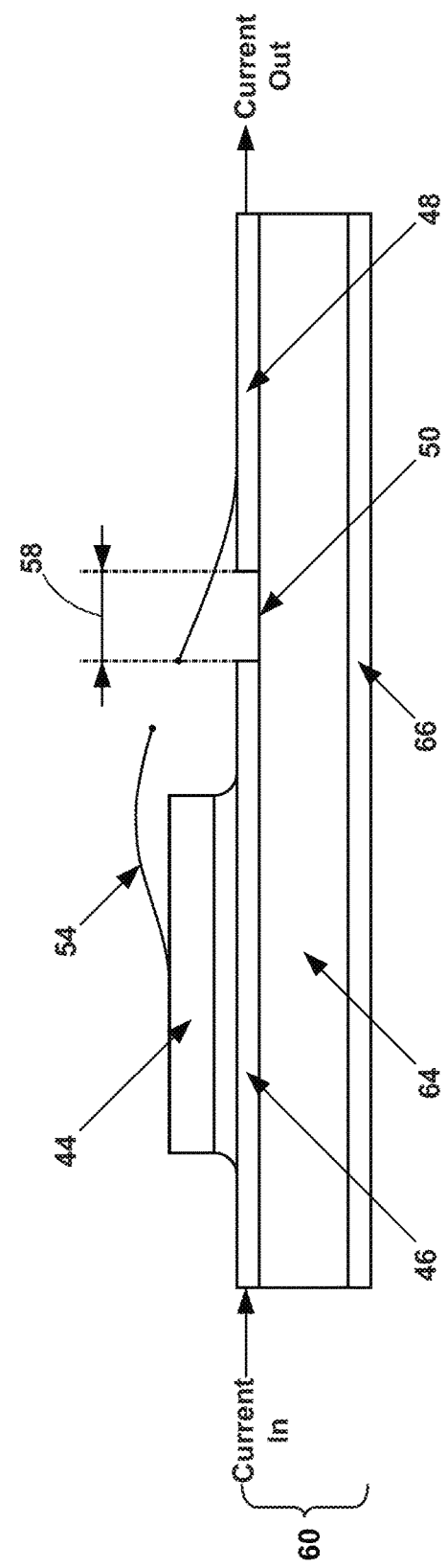

As explained below, a predetermined command sequence is provided to the SSPC 40 to quench the arc 56 and mitigate damage before the state illustrated in FIG. 3C occurs. FIG. 3D illustrates the FET 44 of FIG. 3B where the arc 56 is quenched, or extinguished, prior to the arc 56 burning most of the wire bond 54 and entering the creepage path 50. The circuit 24 is open so that no current flows in the post-quench state. It is beneficial to quench the arc 56 as soon as possible to prevent damage of the creepage path 50 and propagation of the arc 56 to other FETs 44.

Figure 4:
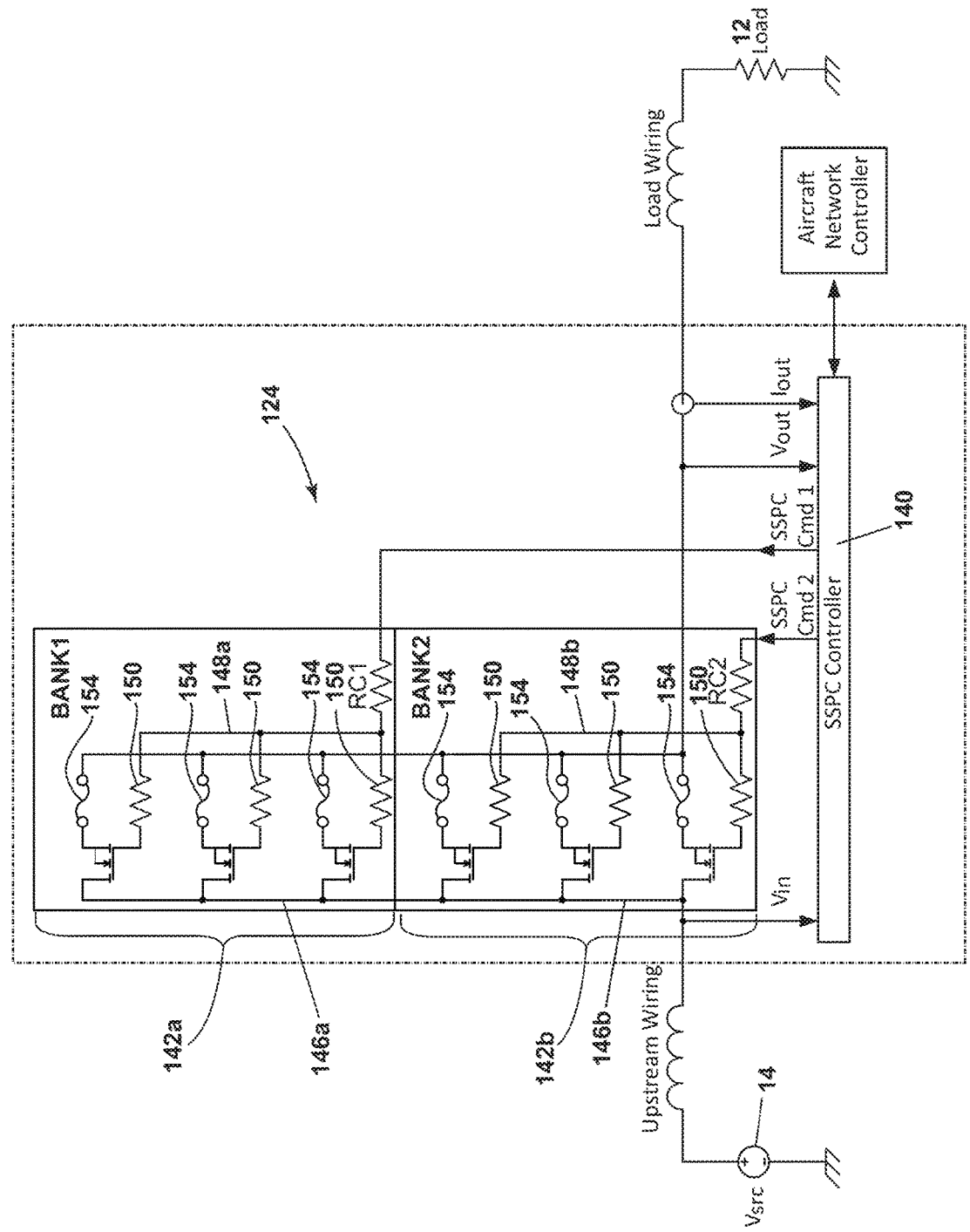
FIG. 4 illustrates a schematic view of another arc mitigation circuit according to various aspects described herein.

FIG. 4 illustrates a circuit 124 according to a second embodiment of the disclosure. The second embodiment is similar to the first embodiment; therefore, like parts will be identified with like numerals increased by 100, with it being understood that the description of the like parts of the first embodiment applies to the second embodiment, unless otherwise noted.

While the first embodiment in FIG. 2 shows one set 42 of FETs 44, it is possible for the circuit 124 to include any number of sets 42 of FETs 44. For example, circuit 124 can include multiple sets or banks of FETs 44. A difference between the first embodiment and the second embodiment is that the circuit 124 includes two sets, 142a and 142b, of FETs 144. The sets 142a and 142b of FETs 144 can be electrically separated from each other in Banks 1 and 2 so that each can function independently of the other as commanded by the SSPC 140. Thus Bank1 will have its own input track 146*a* and output track 148*a*, and Bank 2 will have its own input track 146*b* and output track 148*b*.

Figure 5:
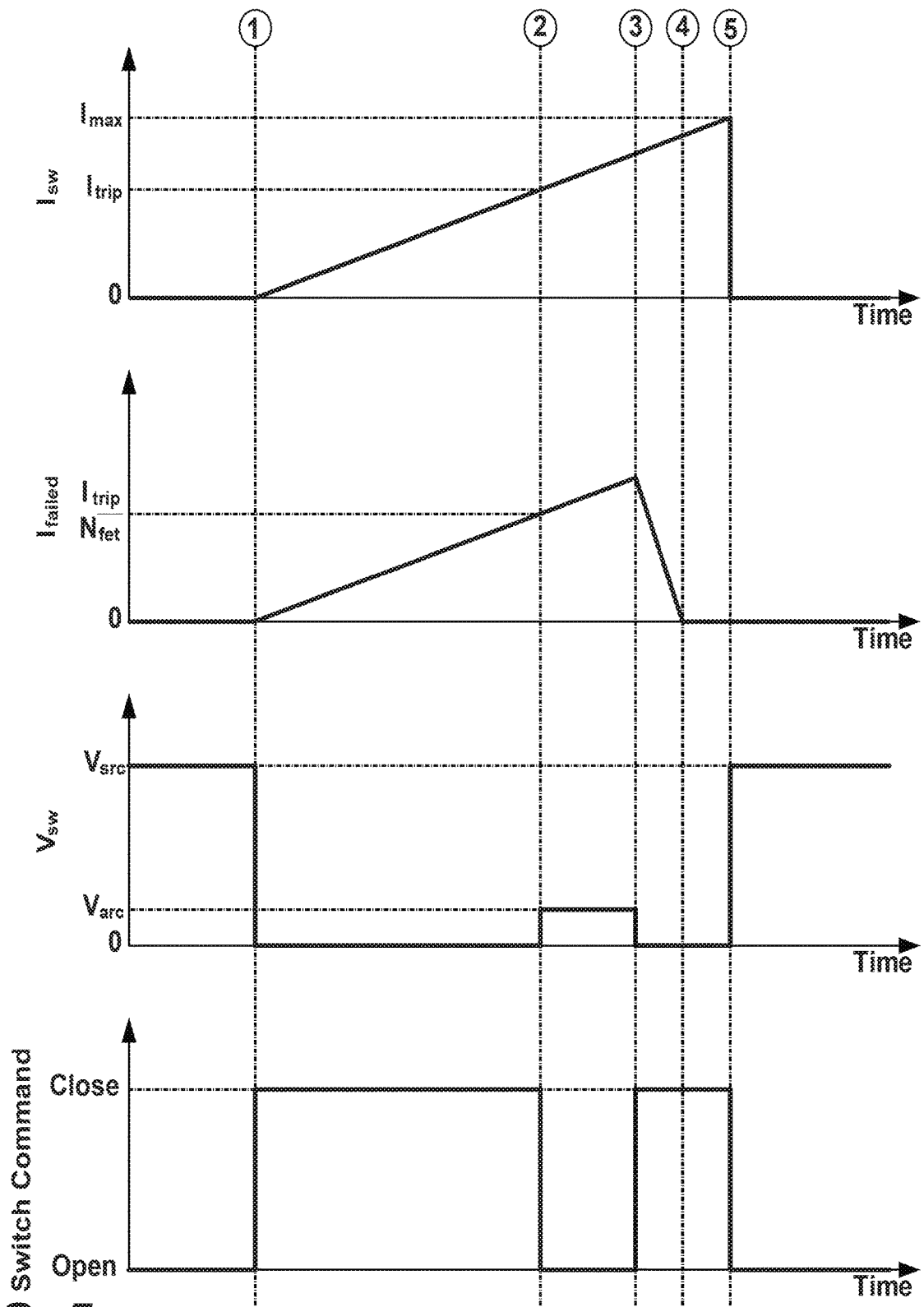
FIG. 5 illustrates a graphical representation of current in a switch circuit, current in a failed FET 44 in the switch circuit, voltage in the switch circuit, and commands of a solid state controller over time according to various aspects described herein.

The predetermined command sequence is illustrated in FIG. 5. In operation, the SSPC 40 can be configured to command the set 42 of FETs 44 to open and close in the predetermined sequence in order to mitigate an arc failure. FIG. 5 illustrates current in the circuit 24, $I_{sw}$, current in a single failed FET 44, hailed, voltage across the SSPC switch or circuit 24, $V_{sw}$, and the command state of the SSPC 40 during operation.

Prior to point (1) the SSPC 40 is commanded to open the set 42, meaning that current through the circuit 24 is at 0. Point (1) reflects a state where a load demand requires closing the circuit 24 to convey power to the load. The SSPC 40 is commanded to close the set 42, but assume there is a short somewhere (e.g., the output track 48) that causes a failure of a single FET 44. As is normal, current begins to rise between point (1) and point (2) when the circuit 24 is closed. But, due to a short circuit at the load, current continues to increase past a current trip threshold at point (2). Then, at point (2) the SSPC 40 detects the failure and is commanded to open the set 42. But current continues to increase through the single failed FET 44 causing the wire bond 54 to fail and strike an arc 56 in the failing wire bond 54 between the input power track 46 and the output power track 48. Consequently, current continues to rise and a voltage of the arc is detected by the SSPC 40, indicating the presence of an arc 56. At point (3), the SSPC 40 detects the arc 56 and is commanded to close the set 42, resulting in the extinguishing of the arc 56. It is contemplated that the time between point (2) and point (3) can be controlled to be in the order of microseconds to avoid contaminating the creepage path 50 with residue from the wire bond 54 in the failed FET 44.

At point (4) the current $I_{failed}$ through the failed FET 44 has fallen to zero and the arc 56 can be determined to be quenched. Alternatively, the SSPC 40 can determine that the arc 56 has been quenched by other means such as sensing light output in the failed FET 44. A predetermined period, or delay is introduced after the arc 56 is quenched at point (4). After the delay, the SSPC 40 at point (5) is commanded to open the set 42. When the set 42 is re-opened, any remaining wire bond 54 material can oxidize and form an insulative alumina layer. After point (5) the circuit current falls to zero, leaving the FETs 44 open. The SSPC 40 is configured to report the SSPC 40 as damaged. Future reclosing of the damaged SSPC 40 can be prevented until the circuit is repaired or checked. In the case of SSPC 140 in another embodiment, the second set 142*b* of FETs can be commanded to close when the first set 142*a* is opened after the foregoing command sequence in the event of a failed FET 144 in set 142*a*. It is contemplated that the requisite delay will be determined empirically for each circuit.

Figure 6:
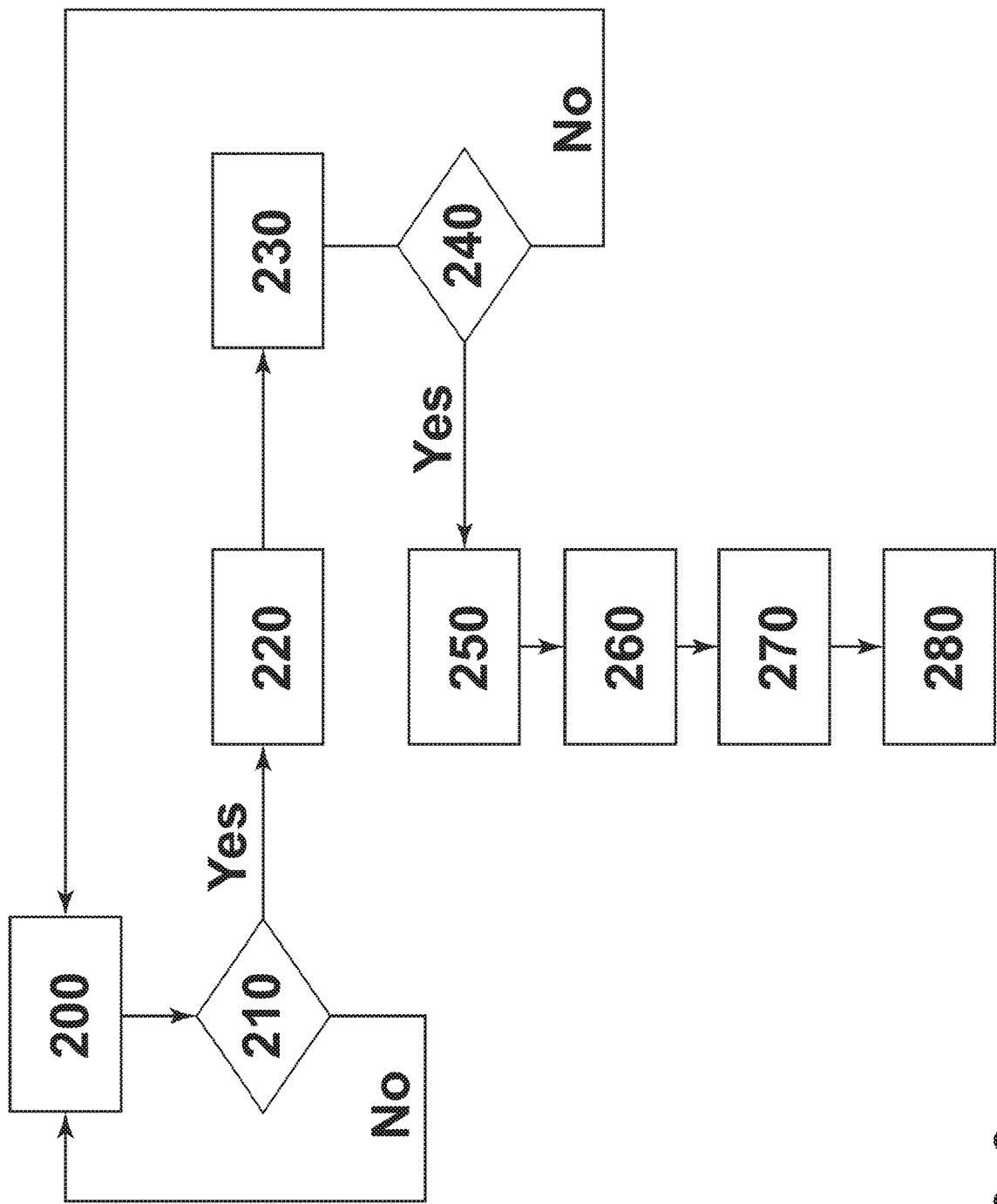
FIG. 6 illustrates a flow chart of a method of mitigating arc failure in an electrical power distribution system according to various aspects described herein.

A method of mitigating arc failure in an electrical power distribution system 20 is illustrated in FIG. 6. At step 200, current is detected through each FET 44 in the set 42. If the detected current exceeds a threshold at step 210, the set 42 of FETs 44 is commanded open at 220. After step 220, current is continued to be detected at 230. If the current continues to rise at 240, which is an indication of an arc 56 failure in a failed FET 44, the set 42 of FETs 44 is commanded closed at 250. A determination is made at step 260 on whether or not the arc 56 has been quenched. Determination that the arc 56 has been quenched can occur by detecting when the current falls to zero or by sensing light output in the failed FET. After the determination at step 260, a predetermined delay time is waited at step 270. The predetermined delay time can be controlled to avoid contaminating the creepage path with residue from the wire bond 54 in the failed FET 44. After step 270, the set 42 is commanded open at step 280. In the case that current does not continue to rise at 240, detection of the current will resume at 200. The method can also include sending a signal representative of the failed FET 44.

The method can also include the set of FETs 42 being a first set 142*a*, and further include commanding a second set of FETs 142*b* to close upon commanding the first set of FETs 142*a* to open if the detected current exceeds the threshold at 210.

It can be appreciated that the electrical power distribution system 20 can provide quenching of arcs 56 in a failed FET 44 without the requirement of isolating the power source 14. Thus, improved product safety and protection against propagation of the arc 56 to other FETs 44 results without additional components in the SSPC 40 design.

To the extent not already described, the different features and structures of the various embodiments can be used in combination, or in substitution with each other as desired. That one feature is not illustrated in all of the embodiments is not meant to be construed that it cannot be so illustrated, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to describe aspects of the disclosure described herein, including the best mode, and also to enable any person skilled in the art to practice aspects of the disclosure, including making and using any devices or systems and performing any incorporated methods. The patentable scope of aspects of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit to mitigate arc failures in an electrical power distribution system comprising:
    a solid state distribution unit having an input and an output, wherein the input is connected to a source of power and output is connected to a load;
    a solid state power controller (SSPC) having a set of field effect transistors (FETs) connected between the input and the output and responsive to command signals from the SSPC;
    each FET in the set having:
        an input power track spaced from an output power track with a creepage path extending between the input power track and the output power track,
        a power semiconductor on the input power track, and
        a wire bond electrically coupled between the power semiconductor and the output power track; and
    the SSPC being configured to command the set to open and close in a predetermined sequence;
    wherein an arc in the wire bond of a failed FET in the set will trigger the predetermined sequence to control current in the failed FET including controlling timing of the predetermined sequence, to quench the arc and isolate remaining wire bond material in the failed FET from contaminating the creepage path, and enable current to bypass the failed FET through at least one other FET in the set to maintain power to the load.

2. The circuit of claim 1 wherein the predetermined sequence includes at least one command to open and at least one command to close.

3. The circuit of claim 1 wherein the SSPC is configured to detect current through each FET in the set.

4. The circuit of claim 3 wherein the predetermined sequence includes a command to the set of FETs to open when current in the failed FET is detected above a threshold.

5. The circuit of claim 1 wherein the SSPC is configured to detect an arc in the failed FET.

6. The circuit of claim 5 wherein the predetermined sequence includes a command to the set of FETs to close when an arc is detected in the failed FET to quench the arc.

7. The circuit of claim 6 wherein timing of the predetermined sequence includes a command to the set of FETs to open after a predetermined period to oxidize remaining wire bond in the failed FET wherein the predetermined period is in the order of microseconds.

8. The circuit of claim 1 wherein the creepage path has a conformal coating material.

9. The circuit of claim 8 wherein the conformal coating material is one of acrylic or silicone.

10. The circuit of claim 1 wherein the wire bond is free of a conformal coating.

11. The circuit of claim 1 comprising two sets of FETs, each set in a bank electrically separated from the other.

12. The circuit of claim 1 wherein voltage in the electrical power distribution system is at least 150 volts of alternating current.

13. The circuit of claim 1 wherein voltage in the electrical power distribution system is at least 270 volts of direct current.

14. A method of mitigating an arc failure in an electrical power distribution system comprising a solid state distribution unit having an input and an output, wherein the input is connected to a source of power and output is connected to a load, a solid state power controller (SSPC) having a set of field effect transistors (FETs) connected between the input and the output and responsive to command signals from the SSPC, each FET in the set having an input power track spaced from an output power track with a creepage path extending between the input power track and the output power track, a power semiconductor on the input power track, and a wire bond electrically coupled between the power semiconductor and the output power track, the method comprising:
  detecting current through each FET in the set;
  commanding the set of FETs to open if the detected current exceeds a threshold;
  commanding the set of FETs to close if the detected current continues to rise after the command to open, indicating an arc failure in a failed FET;
  determining that an arc has quenched;
  waiting a predetermined time after determining that the arc has quenched; and
  commanding the set of FETs to open after the predetermined time.

15. The method of claim 14 wherein the predetermined time is controlled to avoid contaminating the creepage path with residue from the wire bond in the failed FET.

16. The method of claim 14 wherein determining that the arc has quenched occurs by detecting when the current falls to zero.

17. The method of claim 14 wherein determining that the arc has quenched occurs by sensing light output in the failed FET.

18. The method of claim 14 further comprising sending a signal representative of the failed FET.

19. The method of claim 14 wherein the set of FETs is a first set of FETs, and further comprising commanding a second set of FETs to close upon commanding the first set of FETs to open if the detected current exceeds a threshold.

20. A module to mitigate arc failures in an electrical power distribution system in an aircraft, the module comprising:
  a solid state distribution unit having an input and an output, wherein the input is adapted to connect to a source of power and output is adapted to connect to a load in the electrical power distribution system;
  a solid state power controller (SSPC) having a set of field effect transistors (FETs) connected between the input and the output and responsive to command signals from the SSPC;
  each FET in the set having:
  an input power track spaced from an output power track with a creepage path extending between the input power track and the output power track,
  a power semiconductor on the input power track, and
  a wire bond electrically coupled between the power semiconductor and the output power track; and
  the SSPC being configured to command the set to open and close in a predetermined sequence;
  wherein an arc in the wire bond of a failed FET in the set will trigger the predetermined sequence to control current in the failed FET to quench the arc and isolate remaining wire bond material in the failed FET from contaminating the creepage path, and enable current to bypass the failed FET through at least one other FET in the set.

* * * * *